US007417466B2

United States Patent
Akahori

(10) Patent No.: US 7,417,466 B2
(45) Date of Patent: Aug. 26, 2008

(54) FLIP-FLOP CIRCUIT AND FREQUENCY DIVIDER USING THE FLIP-FLOP CIRCUIT

(75) Inventor: Akira Akahori, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/605,226

(22) Filed: Nov. 29, 2006

(65) Prior Publication Data

US 2007/0188197 A1    Aug. 16, 2007

(30) Foreign Application Priority Data

Feb. 10, 2006    (JP)    ............................ 2006-033595

(51) Int. Cl.
    *H03K 3/00*    (2006.01)
(52) U.S. Cl. ....................................... 326/104; 327/218
(58) Field of Classification Search ......... 327/199–203, 327/208–213, 218
    See application file for complete search history.

(56) References Cited

OTHER PUBLICATIONS

Author: Krishnapura, Nagendra and Kinget, Peter☐☐Title: A 5.3 GHz Programmable Divider for HiPerLAN in 0.25uM CMOS☐☐Date:Jul. 2000☐☐Publisher: IEEE Journal of Solid-state Circuit☐☐Vol. 35, No. 7☐☐Pertinent pp. 1019-1024☐☐.*

Krishnapura, N and Kinget, P, A 5.3-GHz Programmable Divider for HiPerLAN in 0.25-um CMOS, IEEE Journal of Solid-State Circuits, vol. 35, No. 7, Jul. 2000, pp.1019-1024.

* cited by examiner

*Primary Examiner*—Rexford Barnie
*Assistant Examiner*—Thienvu V Tran
(74) *Attorney, Agent, or Firm*—Volentine & Whitt, P.L.L.C.

(57) ABSTRACT

In a flip-flop circuit where latched complementary signals of first and second output terminals are inverted by complementary first and second input pulses, the conductivity of a first load transistor connected to the first output terminal is controlled by the signal from the second output terminal, and the conductivity of a second load transistor connected to the second output terminal is controlled by the signal from the first output terminal.

5 Claims, 8 Drawing Sheets

TFF OF FIRST EMBODIMENT OF PRESENT INVENTION

F I G. 1
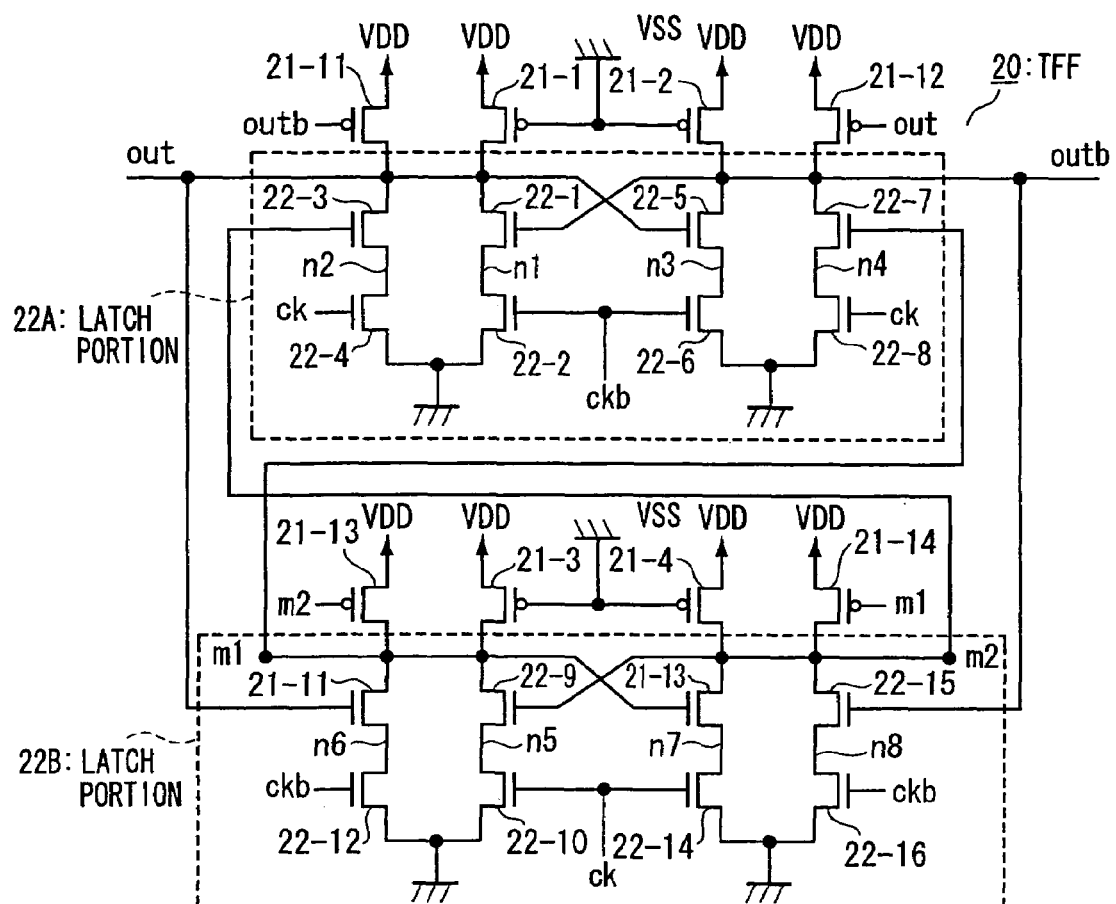
TFF OF FIRST EMBODIMENT OF PRESENT INVENTION

SIMULATION CONDITIONS:
    ASSUMING MOS CREATED ON SOI (SILICON ON INSULATOR)
    POWER SUPPLY VOLTAGE: 1 V
    INPUT SIGNAL FREQUENCY: 7 GHz

1/16 FREQUENCY DIVIDER OF FIG. 2

F I G. 4
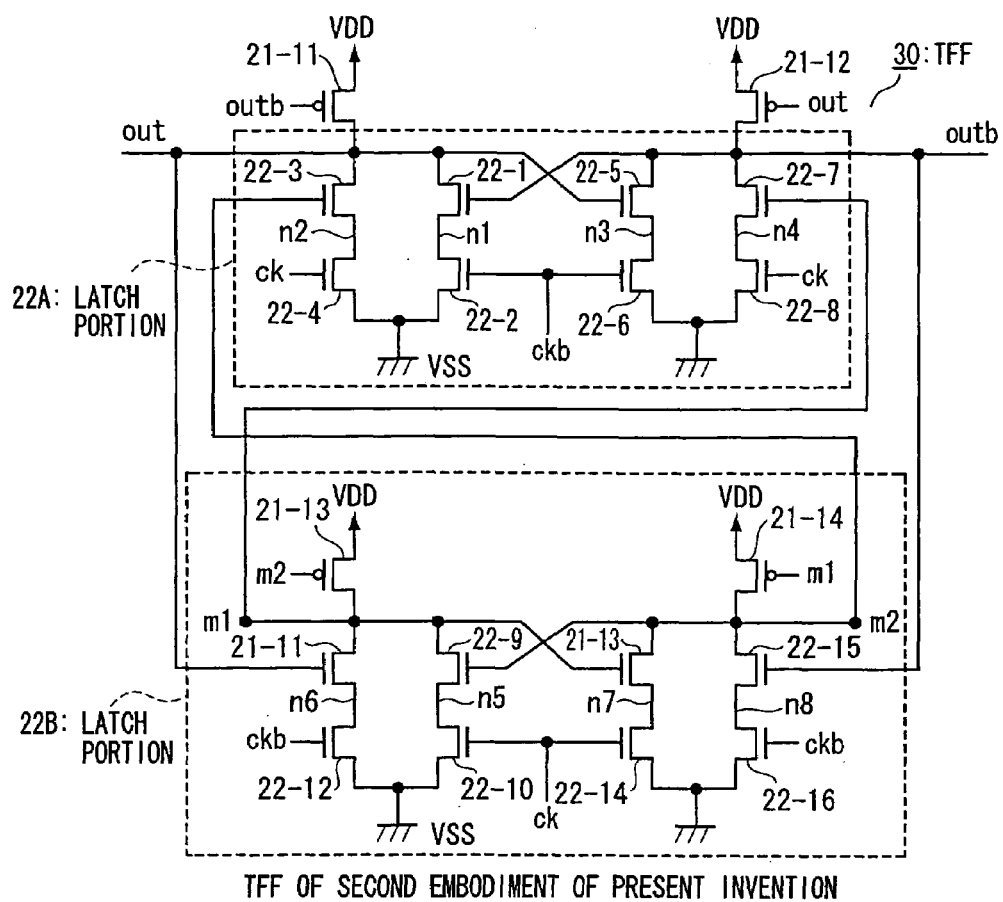
TFF OF SECOND EMBODIMENT OF PRESENT INVENTION

FREQUENCY DIVIDER OF THIRD EMBODIMENT OF PRESENT INVENTION

CONVENTIONAL MCML TFF

CONVENTIONAL 1/2^N FREQUENCY DIVIDER

FLIP-FLOP CIRCUIT AND FREQUENCY DIVIDER USING THE FLIP-FLOP CIRCUIT

CROSS-REFERENCE TO RELATED APPLICATION

This application claims priority under 35 USC 119 from Japanese Patent Application No. 2006-033595, the disclosure of which is incorporated by reference herein.

BACKGROUND OF THE INVENTION

1. Field of the Invention

The present invention relates to a flip-flop circuit (called "FF" below) using a semiconductor device that achieves an increase in operating speed and a reduction in power consumption and to a frequency divider using the flip-flop circuit.

2. Description of the Related Art

Conventionally, as technology relating to a frequency divider that achieves an increase in operating speed and a reduction in power consumption, there has been the frequency divider described in the following document, for example.

N. Krishnapura and Peter R. Kingget, "A 5.3 GHz Programmable Divider for HiPerLAN in 0.25 μm CMOS," *IEEE Journal of Solid-State Circuits*, Vol. 35, No. 7, July 2000, pp. 1019-1024.

In recent years, LSI have become increasingly integrated and sophisticated, and the applied fields thereof have expanded in a wide range. Particularly in accompaniment with the development of wireless communication systems, technological demands to reduce the power consumption of LSI and for high-speed operation of a GHz order have become stronger over the years. Among those, reducing the power consumption of PLL (Phased Locked Loop), which is an important configural circuit in wireless communication systems, has become the most critical issue. And in particular, reducing the power consumption of frequency dividers is extremely effective with respect to reducing the power consumption of PLL. The reason is because a frequency divider used in PLL requires operation of a GHz order depending on the specifications. A frequency divider that operates on a GHz order is an elemental circuit that consumes the most power, and reducing the consumption of this circuit is linked to reducing the power consumption of PLL. A configuration that uses MOS Current Mode Logic (called "MCML" below) has been proposed as a frequency divider that enables a reduction in power consumption while satisfying high-speed operation of a GHz order of a frequency divider. A paper on an applied example of a PLL-use frequency divider using MCML is described in the aforementioned document.

FIG. 7 is a circuit diagram showing a toggle FF (called "TFF" below) 10 using the conventional MCML technology described in the aforementioned document. FIG. 8 is a configural diagram showing a conventional ½ N frequency divider configured as a result of N stages of the TFF 10 of FIG. 7 being cascade-connected.

The MCML TFF 10 of FIG. 7, which is the basic configural circuit of the ½ N frequency divider shown in FIG. 8, is configured by: P-channel MOS transistors (called "PMOS" below; the ON resistance is R and the ON current is I) 11-1 to 11-4 whose input/output signals (e.g., a clock ck that is a first input pulse, an inversion clock ckb that is a second input pulse, a signal of a first output terminal out, and a signal of an inversion output terminal outb that is a second output terminal) all comprise differential complementary signals and which are first, second, third and fourth load elements for obtaining signal amplitude; and first and second latch portions 12A and 12B that comprise N-channel MOS transistors (called "NMOS" below) configuring logic.

The first and second latch portions 12A and 12B are connected to the output terminal out and the inversion output terminal outb. The output terminal out is connected to a first power supply potential VDD via a drain electrode/source electrode of the PMOS 11-1 of the first latch portion 12A, and a gate electrode of the PMOS 11-1 is connected to a ground potential VSS that is a second power supply potential. The inversion output terminal outb is connected to the power supply potential VDD via a drain electrode/source electrode of the PMOS 11-2, and a gate electrode of the PMOS 11-2 is connected to the ground potential VSS. A first output node m1 of complementary first and second output nodes m1 and m2 of the second latch portion 12B is connected to the power supply potential VDD via a drain electrode/source electrode of the PMOS 11-3, and a gate electrode of the PMOS 11-3 is connected to the ground potential VSS. The second output node m2 is connected to the power supply potential VDD via a drain electrode/source electrode of the PMOS 11-4, and a gate electrode of the PMOS 11-4 is connected to the ground potential VSS.

The first latch portion 12A is configured by first to eighth NMOS 12-1 to 12-8. The output terminal out is connected to the ground potential VSS via a drain electrode/source electrode of the first NMOS 12-1, a first node n1, and a drain electrode/source electrode of the second NMOS 12-2, and is connected to the ground potential VSS via a drain electrode/source electrode of the third NMOS 12-3, a second node n2, and a drain electrode/source electrode of the fourth NMOS 12-4. A gate electrode of the NMOS 12-1 is connected to the inversion output terminal outb, the inversion clock ckb is applied to a gate electrode of the NMOS 12-2, a gate electrode of the NMOS 12-3 is connected to the second output node m2, and the clock ck is applied to a gate electrode of the NMOS 12-4.

The inversion output terminal outb is connected to the ground potential VSS via a drain electrode/source electrode of the fifth NMOS 12-5, a third node n3, and a drain electrode/source electrode of the sixth NMOS 12-6, and is connected to the ground potential VSS via a drain electrode/source electrode of the seventh NMOS 12-7, a fourth node n4, and a drain electrode/source electrode of the eighth NMOS 12-8. A gate electrode of the NMOS 12-5 is connected to the output terminal out, the inversion clock ckb is applied to a gate electrode of the NMOS 12-6, a gate electrode of the NMOS 12-7 is connected to the first output node m1, and the clock ck is applied to a gate electrode of the NMOS 12-8.

The second latch portion 12B is configured by ninth to sixteenth NMOS 12-9 to 12-16. The first output node m1 is connected to the ground potential VSS via a drain electrode/source electrode of the ninth NMOS 12-9, a fifth node n5, and a drain electrode/source electrode of the tenth NMOS 12-10, and is connected to the ground potential VSS via a drain electrode/source electrode of the eleventh NMOS 12-11, a sixth node n6, and a drain electrode/source electrode of the twelfth NMOS 12-12. A gate electrode of the NMOS 12-9 is connected to the second output node m2, the clock ck is applied to a gate electrode of the NMOS 12-10, a gate electrode of the NMOS 12-11 is connected to the output terminal out, and the inversion clock signal ckb is applied to a gate electrode of the NMOS 12-12.

The second output node m2 is connected to the ground potential VSS via a drain electrode/source electrode of the thirteenth NMOS 12-13, a seventh node n7, and a drain electrode/source electrode of the fourteenth NMOS 12-14, and is connected to the ground potential VSS via a drain electrode/source electrode of the fifteenth NMOS 12-15, an eighth node n8, and a drain electrode/source electrode of the sixteenth NMOS 12-16. A gate electrode of the NMOS 12-13 is connected to the output node m1, the clock ck is applied to a gate electrode of the NMOS 12-14, a gate electrode of the NMOS 12-15 is connected to the inversion output terminal outb, and the inversion clock ckb is applied to a gate electrode of the NMOS 12-16.

As for the operation of the MCML TFF 10 of FIG. 7, the PMOS 11-1 to 11-4 are always in an ON state, and in an initial state, when the output terminal out is "0", the inversion output terminal outb is "1", the output node m1 is "1" and the output node m2 is "0", for example, then the NMOS 12-1, 12-7, 12-13 and 12-15 are ON and the NMOS 12-3, 12-5, 12-11 and 12-9 are OFF.

When the clock ck becomes "1" and the inversion clock ckb becomes "0", then the NMOS 12-4, 12-8, 12-10 and 12-14 are switched to an ON state and the NMOS 12-2, 12-6, 12-12 and 12-16 are switched to an OFF state. Then, the inversion output terminal outb is lowered toward the ground potential VSS by the NMOS 12-7 and 12-8 in the ON state and becomes "0". At this time, the output node m2 is maintained at "0" and the output node m1 is maintained at "1" by the NMOS 12-13 and 12-14 in the ON state. When the inversion output terminal outb becomes "0", then the NMOS 12-1 is switched to an OFF state, and the output terminal out is raised in the power supply potential VDD direction via the PMOS 11-1 and becomes "1". Thus, the output terminal out and the inversion output terminal outb are inverted from "0" and "1" to "1" and "0".

When the clock ck becomes "0" and the inversion clock ckb becomes "1", then the NMOS 12-4, 12-8, 12-10 and 12-14 are switched to an OFF state and the NMOS 12-2, 12-6, 12-12 and 12-16 are switched to an ON state. Then, the inversion output terminal outb is maintained at "0" and the output terminal out is maintained at "1" by the NMOS 12-5 and 12-6 in the ON state. At this time, the output node m1 is lowered toward the ground potential VSS by the NMOS 12-11 and 12-12 in the ON state and becomes "0", and the output node m2 is raised toward the power supply potential VDD via the PMOS 11-4 by the NMOS 12-13 and 12-14 in the OFF state and becomes "1".

Next, when the clock ck becomes "1" and the inversion clock ckb becomes "0", the output terminal out is lowered toward the ground potential VSS by the NMOS 12-3 and 12-4 in the ON state and becomes "0", and the inversion output terminal outb is raised toward the power supply potential VDD by the PMOS 11-2 and becomes "1". Thus, the NMOS 12-11 is switched to an OFF state, the NMOS 12-15 is switched to an ON state, the output node m1 is raised toward the power supply potential VDD via the PMOS 11-3 and becomes "1", and the output node m2 is lowered toward the ground potential VSS by the NMOS 12-13 and 12-14 in the ON state and becomes "0". Thus, the output terminal out and the inversion output terminal outb are inverted from "1" and "0" to "0" and "1".

In this manner, in the MCML TFF 10 of FIG. 7, each time the clock ck becomes "1" and the inversion clock ckb becomes "0", the logic levels of the output terminal out and the inversion output terminal outb are inverted, and counting is performed to halve the number of inputted clocks ck (or inversion clocks ckb). For this reason, when N stages of the TFF 10 are cascade-connected as in the frequency divider of FIG. 8, the frequency of the inputted clock ck (or inversion clock ckb) becomes divided into ½ N.

Here, in the MCML TFF 10 of FIG. 7, a high level (called "H level" below) of signal is defined as the power supply potential VDD level and a low level (called "L level" below) is defined as a level that has fallen IR from the power supply potential VDD level, so the signal amplitude becomes IR.

Whereas the signal amplitude of a commonly used complementary MOS (called "CMOS" below) logic circuit is the power supply potential VDD, the signal amplitude of an MCML TFF 10 becomes IR, and this is linked to a reduction in charge and discharge time and means an improvement in operating speed. Moreover, in contrast to a CMOS logic circuit, there is no logic threshold voltage with respect to changes in the input signal, and the changing of the output signal by the input signal amplitude of about the threshold voltage of NMOS also contributes to increasing speed. Additionally, because the MCML TFF 10 operates by differential complementary signals, being resistant to common mode noise also enables high-speed operation.

From the standpoint of power consumption, in the MCML TFF 10, in contrast to a CMOS logic circuit, current always flows from the power supply potential VDD because the PMOS 11-1 to 11-4 that are loads are ON. Because the MCML TFF 10 operates at a higher speed than a CMOS logic circuit if its operating frequency is in a high range, the power supply potential VDD can be reduced, and a reduction in power consumption is possible in comparison to a CMOS circuit. In contrast, a CMOS logic circuit does not in principle consume power when the circuit is not operating because either the PMOS or the NMOS are always OFF. However, in the MCML TFF 10, current always flows from the power supply potential VDD, so that when the circuit is not operating or when the input signal frequency of the TFF 10 is slow and the operating rate of the gate is extremely low, less power is consumed when a CMOS logic circuit is used. For this reason, the MCML TFF 10 and a frequency divider using the MCML TFF 10 can be said to be circuits directed toward a GHz order.

Because the MCML TFF 10 and a frequency divider using the MCML TFF 10 operate at a high speed in comparison to when a CMOS logic circuit is used, it becomes possible to reduce the power supply potential VDD and they are suited to reducing power consumption at the time of high-speed operation at a GHz order. However, in a range where the operating frequency is low, power consumption becomes greater in comparison to a CMOS logic circuit. Because the frequency of the signal falls toward the TFF of the later stages, a method can also be considered where the MCML TFF 10 is used when it is necessary to cause the frequency divider to operate at a high speed and where a CMOS logic circuit is used when the frequency has fallen a certain extent. However, the great advantage of the MCML TFF 10 that a CMOS logic circuit does not have is that it is resistant to common mode noise because it operates by differential complementary signals. This characteristic becomes an extremely important advantage when stable operation of the frequency divider with respect to reducing the voltage of the power supply potential VDD is considered. For that reason, the MCML TFF 10 and a frequency divider using the MCML TFF 10 become extremely important circuits with respect to reducing the voltage of the power supply potential VDD in the future. Thus, reducing power consumption while preserving the differential circuit format having the characteristic that it is resistant to common mode noise becomes an issue of the MCML TFF 10 and a frequency divider using the MCML TFF 10.

As a solution therefor, when, for example, a high-frequency circuit block and a low-frequency circuit block in a frequency divider are configured using the conventional MCML TFF 10, a reduction in power consumption can be achieved when the dimensions of the PMOS 11-1 to 11-4 that are load transistors in the low-frequency circuit block are made much smaller than the dimensions of the PMOS 11-1 to 11-4 that are load transistors in the high-frequency circuit block, but on the other hand, the potential arises for the rise speed of the H level signal from the TFF 10 of the low-frequency circuit block to fall so that, as a result, the desired circuit operation can no longer be achieved. Conversely, when the dimensions of the PMOS 11-1 to 11-4 in the low-frequency circuit block are made much smaller than the dimensions of the PMOS 11-1 to 11-4 in the high-frequency circuit block, the rise speed of the H level signal from the TFF 10 of the low-frequency circuit block can be maintained at a desired level, but on the other hand, it becomes difficult to achieve a reduction in power consumption.

Consequently, there has been a strong desire to achieve an FF and a frequency divider using the FF that can reduce power consumption while maintaining the rise speed of the H level signal (or the fall speed of the L level signal) from the TFF.

SUMMARY OF THE INVENTION

The present invention has been made in view of the above circumstances and provides a flip-flop circuit and a frequency divider.

According to a first aspect of the invention, there is provided a flip-flop circuit comprising: a first load element which, of first and second output terminals that output complementary signals, is connected between the first output terminal and a first power supply potential and through which power supply current flows; a second load element that is connected between the first power supply potential and the second output terminal and through which power supply current flows; a first load transistor that is connected between the first power supply potential and the first output terminal and whose conductive state is controlled by the signal of the second output terminal; a second load transistor that is connected between the first power supply potential and the second output terminal and whose conductive state is controlled by the signal of the first output terminal; a first latch portion that is connected between a second power supply potential different from the first power supply potential and the first and second output terminals, latches the signals of the first and second output terminals, and inverts the latched signals of the first and second output terminals by complementary first and second input pulses and complementary signals of first and second output nodes; a third load element that is connected between the first power supply potential and the first output node and through which power supply current flows; a fourth load element that is connected between the first power supply potential and the second output node and through which power supply current flows; a third load transistor that is connected between the first power supply potential and the first output node and whose conductive state is controlled by the signal of the second output node; a fourth load transistor that is connected between the first power supply potential and the second output node and whose conductive state is controlled by the signal of the first output node; and a second latch portion that is connected between the second power supply potential and the first and second output nodes, latches the signals of the first and second output nodes, and inverts the latched signals of the first and second output nodes by the first and second input pulses and the signals of the first and second output terminals.

BRIEF DESCRIPTION OF THE DRAWINGS

Preferred embodiments of the present invention will be described in detail based on the following figures, wherein:

FIG. 1 is a circuit diagram of a TFF pertaining to a first embodiment of the present invention;

FIG. 4 is a circuit diagram of a TFF pertaining to a second embodiment of the present invention;

DETAILED DESCRIPTION OF THE INVENTION

A TFF is an FF where the signals of complementary first and second output terminals latched in latch portions are inverted by complementary first and second input pulses and where the conductivity of a first load transistor connected to the first output terminal is controlled by the signal from the second output terminal and the conductivity of a second load transistor connected to the second output terminal is controlled by the signal from the first output terminal.

A ½ N frequency divider is a divider where circuit blocks comprising TFF are cascade-connected in N stages to divide the frequencies of the complementary first and second input pulses into ½ N and where the circuit block whose frequency is high is configured by conventional TFF and the circuit block whose frequency is low or intermediate is configured by the aforementioned TFF.

First Embodiment (Configuration of First Embodiment)

FIG. 1 is a circuit diagram of a TFF 20 pertaining to a first embodiment of the present invention.

Figure 7:
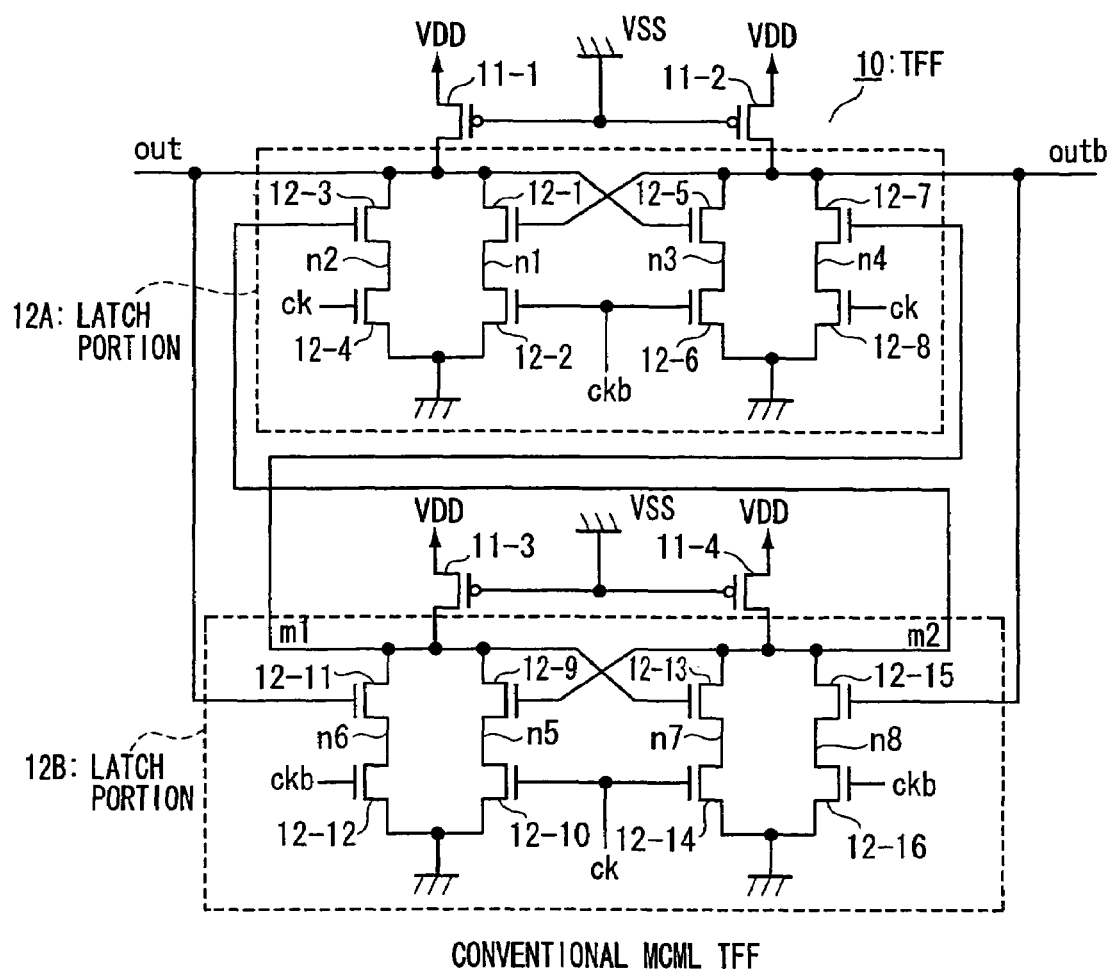
FIG. 7 is a circuit diagram of a conventional MCML TFF.
Figure 8:
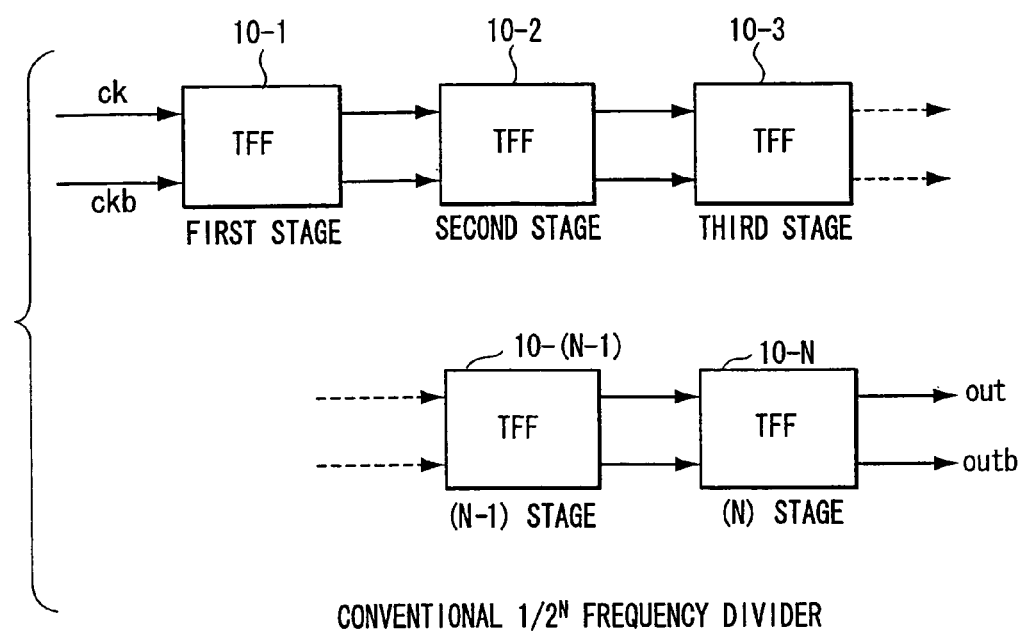
FIG. 8 is a configural diagram showing a conventional ½ N frequency divider.

Similar to the conventional MCML TFF 10 of FIG. 7, the TFF 20 of the first embodiment is configured by: PMOS (the ON resistance is R, the ON current is I) 21-1 to 21-4 whose input/output signals (e.g., a clock ck that is a first input pulse, an inversion clock ckb that is a second input pulse, a signal of a first output terminal out, and a signal of an inversion output terminal outb that is a second output terminal) all comprise differential complementary signals and which are first, second, third and fourth load elements for obtaining signal amplitude; first, second, third and fourth load transistors (e.g., PMOS) 21-11 to 21-14 newly added to the conventional TFF 10; and first and second latch portions 22A and 22B comprising NMOS that configure the same logic as the first and second latch portions 12A and 12B in the conventional TFF 10.

The first and second latch portions 22A and 22B are connected to the output terminal out and the inversion output terminal outb. The output terminal out is connected to a first power supply potential VDD via a drain electrode/source electrode of the PMOS 21-1 in the first latch portion 22A and is connected to a first power supply potential VDD via a drain electrode/source electrode of the PMOS 21-11. A gate electrode of the PMOS 21-1 is connected to a ground potential VSS that is a second power supply potential, and the PMOS 21-1 is always in an ON state. A gate electrode of the PMOS 21-11 is connected to the inversion output terminal outb. The inversion output terminal outb is connected to the power supply potential VDD via a drain electrode/source electrode of the PMOS 21-2 and is connected to the power supply potential VDD via a drain electrode/source electrode of the PMOS 21-12. A gate electrode of the PMOS 21-2 is connected to the ground potential VSS and the PMOS 21-2 is always in an ON state. A gate electrode of the PMOS 21-12 is connected to the output terminal out.

A first output node m1 of complementary first and second output nodes m1 and m2 in the second latch portion 22B is connected to the power supply potential VDD via a drain electrode/source electrode of the PMOS 21-3 and is connected to the power supply potential VDD via a drain electrode/source electrode of the PMOS 21-13. A gate electrode of the PMOS 21-3 is connected to a ground potential VSS and the PMOS 21-3 is always in an ON state. A gate electrode of the PMOS 21-13 is connected to the second output node m2. The second output node m2 is connected to the power supply potential VDD via a drain electrode/source electrode of the PMOS 21-4 and is connected to the power supply potential VDD via a drain electrode/source electrode of the PMOS 21-14. A gate electrode of the PMOS 21-4 is connected to the ground potential VSS and the PMOS 21-4 is always in an ON state. A gate electrode of the PMOS 21-14 is connected to the first output node m1.

The first latch portion 22A has the same configuration as that of the first latch portion 12A in the conventional TFF 10, and is configured by first to eighth NMOS 22-1 to 22-8 and first to fourth nodes n1 to n4. The first to eighth NMOS 22-1 to 22-8 correspond to the conventional first to eighth NMOS 12-1 to 12-8.

The second latch portion 22B has the same configuration as that of the second latch portion 22B in the conventional TFF 10, and is configured by ninth to sixteenth NMOS 22-9 to 22-16 and fifth to eighth nodes n5 to n8. The ninth to sixteenth NMOS 22-9 to 22-16 correspond to the conventional ninth to sixteenth NMOS 12-9 to 12-16.

Figure 2:
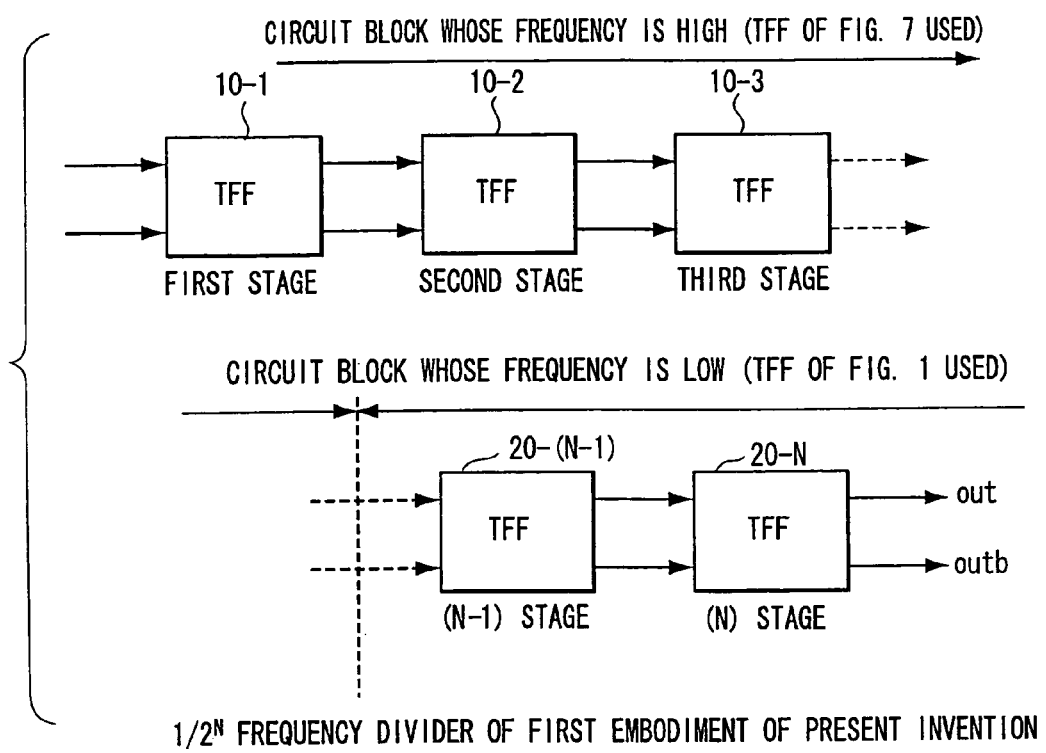
FIG. 2 is a configural diagram of a ½ N frequency divider pertaining to the first embodiment of the present invention.

FIG. 2 is a configural diagram of a ½ N frequency divider pertaining to the first embodiment of the present invention.

The ½ N frequency divider of the first embodiment is configured as a result of N stages of TFF being cascade-connected, but the conventional MCML TFF 10-1 to 10-3 are used in the circuit block whose frequency is high and the TFF 20-(N−1) and 20-N of the first embodiment are used in the circuit block whose frequency is low.

The dimensions of the load-use PMOS 21-1 to 21-4 and 21-11 to 21-14 in the TFF 20 of the first embodiment are set as follows, for example.

The dimensions of the PMOS 21-1 and 21-11 are set such that the combined drive capability of the two PMOS 21-1 and 21-11 of FIG. 1 and the drive capability of the one load-use PMOS 11-1 of FIG. 7 are equal. Similarly, the dimensions of the PMOS 21-2 to 21-4 and 21-12 to 21-14 are set such that the combined drive capability of the PMOS 21-2 and 21-12 of FIG. 1 and the drive capability of the load-use PMOS 11-2 of FIG. 1 are equal, the combined drive capability of the PMOS 21-3 and 21-13 of FIG. 1 and the drive capability of the load-use PMOS 11-3 of FIG. 7 are equal, and the combined drive capability of the PMOS 21-4 and 21-14 of FIG. 1 and the drive capability of the load-use PMOS 11-4 of FIG. 7 are equal.

That is, the dimensions are set such that the drive capability of the load-use PMOS (one each of the PMOS 11-1 to 11-4) of the TFF (1) in the circuit block whose frequency is high and the drive capability of the load-use PMOS (two each of the PMOS 21-1 and 21-11 to 21-4 and 21-14) of each of the TFF (2) to TFF (4) in the circuit block whose frequency is low are equal. For example, the dimensions are set such that the ratio between the gate width of the PMOS 21-1 of FIG. 1, the gate width of the PMOS 21-11 of FIG. 1, and the gate width of the PMOS 11-1 of FIG. 7 is 1:1:2 (with the gate lengths being the same in regard to all PMOS). The same is true of the PMOS 21-2 and 21-12 to 21-4 and 21-14.

(Operation of First Embodiment)

In the TFF 20 of FIG. 1, similar to what has conventionally been the case, the PMOS 21-1, 21-2, 21-3 and 21-4 are always in an ON state. The gate electrode of the PMOS 21-11 is connected to the inversion output terminal outb, the gate electrode of the PMOS 21-12 is connected to the output terminal out, the gate electrode of the PMOS 21-13 is connected to the output node m2, and the gate electrode of the PMOS 21-14 is connected to the output node m1. The signal of the output terminal out and the signal of the inversion output terminal outb, and the signal of the output node m1 and the signal of the output node m2, are differential complementary signals.

In a state where the signal of the output node m1 is "1" and the signal of the output node m2 is "0", the PMOS 21-13 is switched to an ON state and the PMOS 12-14 is switched to an OFF state. Similarly, when the signal of the output terminal out is "0" and the signal of the inversion output terminal outb is "1", the PMOS 21-11 is switched to an OFF state and the PMOS 21-12 is switched to an ON state. By controlling the PMOS 21-11 to 21-14 that are load transistors using combinations of the differential complementary signals of the signal of the output node m1 and the signal of the output node m2 and the signal of the output terminal out and the signal of the inversion output terminal outb, it becomes possible to control the current from the power supply potential VDD to the ground potential VSS, and this enables a reduction in the power consumption of single TFF.

Additionally, by configuring the entire frequency divider shown in FIG. 2 using the conventional MCML TFF 10-1 to 10-3 in the circuit block operated at a high speed and using the TFF 20-(N−1) and 20-N of the first embodiment in the circuit block whose frequency has fallen, the power consumption of the entire frequency divider can be reduced. It will be noted that the circuit block operated at a high speed and the circuit block operated at a low speed may be appropriately selected on the basis of the following simulation result, for example.

Figure 3:
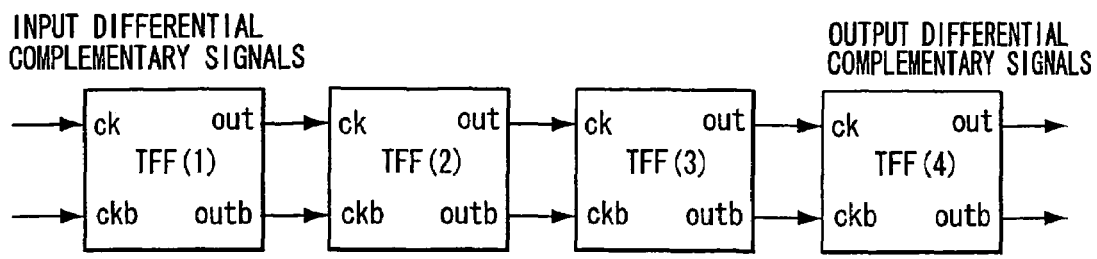
FIG. 3 is a diagram showing the result of a simulation using the ⅟₁₆ frequency divider of FIG. 2.

FIG. 3 is a diagram showing the result of a simulation using a ¹⁄₁₆ N frequency divider comprising 4-stage TFF (1) to TFF (4) in FIG. 2. The above-described effect of reducing power consumption will be described using FIG. 3.

The simulation is performed assuming a case where the circuits are created on an SOI (Silicon On Insulator) board, the power supply potential is 1 V, and the input signal frequencies that are the clock ck and the inversion clock ckb are 7 GHz. When the 4-stage TFF (1) to TFF (4) shown in FIG. 3 are configured using the conventional MCML TFF 10, the power consumption is 2.4 mW. In contrast, when the TFF (1) of the first stage is configured by the conventional MCML TFF 10 and the TFF (2) of the second stage to the TFF (4) of the fourth stage are configured by the TFF 20 of the first embodiment, the power consumption is 1.8 mW, so that the power consumption is able to be reduced by about 25%.

(Effects of First Embodiment)

According to the first embodiment, there are the following effects (a) and (b).

(a) According to the TFF 20 of FIG. 1, the conductivity of the load-use PMOS 21-11 connected to the output terminal out is controlled by the signal from the inversion output terminal outb, and the conductivity of the load-use PMOS 21-12 connected to the inversion output terminal outb is controlled by the signal from the output terminal out. By adopting this configuration, an L level signal is outputted from the inversion output terminal outb when an H level signal is outputted from the output terminal out, so that both of the PMOS 21-1 and 21-11 are switched to an ON state and an H level signal from the output terminal out rises at the desired speed. At this time, on the other hand, the PMOS 21-12 connected to the inversion output terminal outb outputting the L level signal is OFF, so that the power consumption can be controlled in an amount corresponding to the PMOS 12-12 being in the OFF state. Similarly, even when an H level signal is outputted from the inversion output terminal outb, the rise speed of that H level signal is maintained by the PMOS 21-2 and 21-12 in the ON state, and it becomes possible to control the power consumption in an amount corresponding to the PMOS 21-11 being in the OFF state. Through control of the load-use PMOS 21-11 to 21-14 in this manner, control of the current from the power supply potential VDD is performed and the power consumption of single TFF can be reduced.

(b) According to the ½ N frequency divider of FIG. 2, the frequency divider is configured using the conventional MCML TFF 10-1 to 10-3 with respect to the circuit block operated at a high speed and using the TFF 20-(N−1) and 20-N of the first embodiment with respect to the circuit block whose frequency has fallen. By adopting this configuration, reduction of the power consumption of the entire frequency divider can be performed.

Second Embodiment

(Configuration of Second Embodiment)

FIG. 4 is a circuit diagram of a TFF 30 pertaining to a second embodiment of the present invention. Common reference numerals are given to elements in common with the elements in FIG. 1 representing the TFF 20 of the first embodiment.

The TFF 30 of the second embodiment has a configuration where the load-use PMOS 21-1 to 21-4 in the TFF 20 of the first embodiment are omitted.

Figure 5:
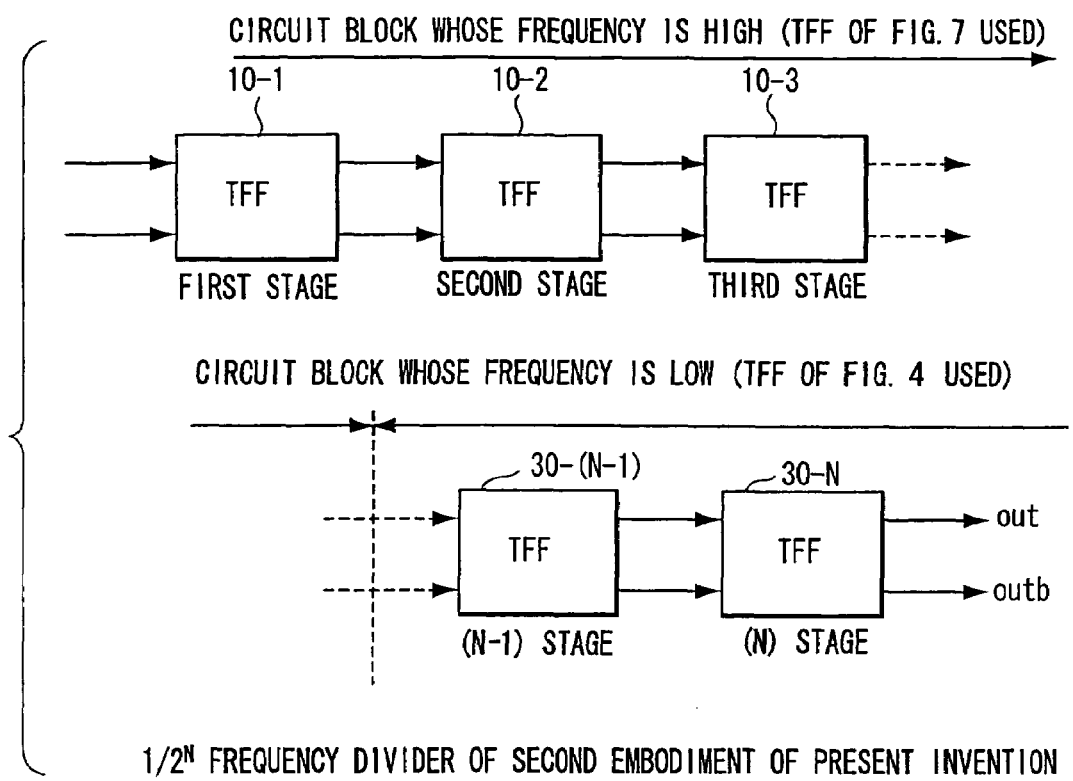
FIG. 5 is a configural diagram of a ½ N frequency divider pertaining to the second embodiment of the present invention.

FIG. 5 is a configural diagram of a ½ N frequency divider pertaining to the second embodiment of the present invention.

The ½ N frequency divider of the second embodiment is configured as a result of N stages of TFF being cascade-connected, but the conventional MCML TFF 10-1 to 10-3 are used in the circuit block whose frequency is high and the TFF 30-(N−1) to 30-N of the second embodiment are used in the circuit block whose frequency is low.

The dimensions of the load-use PMOS 21-11 to 21-14 in the TFF 30 of the second embodiment are set as follows, for example.

The dimensions of the PMOS 21-11 are set such that the drive capability of the PMOS 21-11 of FIG. 4 and the drive capability of the load-use PMOS 11-1 of FIG. 7 are equal. Similarly, the dimensions of the PMOS 21-12 to 21-14 are set such that the drive capability of the PMOS 21-12 of FIG. 4 and the drive capability of the load-use PMOS 11-2 of FIG. 7 are equal, the drive capability of the PMOS 21-13 of FIG. 4 and the drive capability of the load-use PMOS 11-3 of FIG. 7 are equal, and the drive capability of the PMOS 21-14 of FIG. 4 and the drive capability of the load-use PMOS 11-4 of FIG. 7 are equal.

That is, the dimensions are set such that the drive capability of the load-use PMOS (one of the PMOS 11-1 to 11-4) of the TFF 10-1 to 10-3 in the circuit block whose frequency is high and the drive capability of the load-use PMOS (each of the PMOS 21-11 to 21-14) of the TFF 30-(N−1) and 30-N in the circuit block whose frequency is low are equal. For example, the dimensions are set such that the ratio between the gate width of the PMOS 21-11 of FIG. 4 and the gate width of the PMOS 11-1 of FIG. 7 is 1:1 (with the gate lengths being the same in regard to all PMOS). The same is true of the PMOS 21-12 to 21-14.

(Operation of Second Embodiment)

In the TFF 30 of FIG. 4, the gate electrode of the PMOS 21-11 and the inversion output terminal outb are connected, the gate electrode of the PMOS 21-12 and the output terminal out are connected, the gate electrode of the PMOS 21-13 and the second output node m2 are connected, and the gate electrode of the PMOS 21-14 and the first output node m1 are connected. The signal of the output terminal out and the signal of the inversion output terminal outb, and the signal of the first output node m1 and the signal of the second output node m2, are differential complementary signals.

For example, when the signal of the output terminal out is "1" and the signal of the inversion output terminal outb is "0", the PMOS 21-11 is switched to an ON state and the PMOS 21-12 is switched to an OFF state, so that the current from the power supply potential VDD can be controlled. Similarly, when the signal of the output node m1 is "0" and the signal of the output node m2 is "1", the PMOS 21-13 is switched to an OFF state and the PMOS 21-14 is switched to an ON state, so that the current from the power supply potential VDD can be controlled. By adopting the configuration of FIG. 4, the consumed current from the power supply potential VDD can be controlled, which enables a reduction in the power consumption of single TFF.

Additionally, by configuring the entire frequency divider shown in FIG. 5 using the conventional MCML TFF 10-1 to 10-3 in the circuit block operated at a high speed and using the TFF 30-(N−1) and 30-N of the second embodiment in the circuit block whose frequency has fallen, the power consumption of the entire frequency divider can be reduced. It will be noted that the circuit block operated at a high speed and the circuit block operated at a low speed may be appropriately selected on the basis of the following simulation result, for example.

The above-described effect of reducing power consumption will be described using the simulation result of the 1/16 frequency divider shown in FIG. 3.

As described in the first embodiment, the simulation is performed assuming that the circuits are MOS transistors created on an SOI board and under the conditions that the power supply potential is 1 V and the input signals are 7 GHz. When the 4-stage TFF (1) to TFF (4) configuring the 1/16 frequency divider in FIG. 3 are configured using the conventional MCML TFF 10 shown in FIG. 7, the power consumption is 2.4 mW. In contrast, the TFF (1) and the TFF (2) are configured using the conventional MCML TFF 10 shown in FIG. 7 and the TFF (3) and the TFF (4) are configured using the TFF 30 of FIG. 4. As a result, the power consumption is 1.7 mW, so that the power consumption is able to be reduced by about 28%.

(Effects of Second Embodiment)

According to the first embodiment, there are the following effects (a) and (b).

(a) According to the TFF 30 of FIG. 4, similar to the first embodiment, the conductivity of the load-use PMOS 21-11 connected to the output terminal out is controlled by the signal from the inversion output terminal outb, and the conductivity of the load-use PMOS 21-12 connected to the inversion output terminal outb is controlled by the signal from the output terminal out. By adopting this configuration, an L level signal is outputted from the inversion output terminal outb when an H level signal is outputted from the output terminal out, so that the PMOS 21-11 is switched to an ON state and the H level signal from the output terminal out rises at the desired speed. At this time, on the other hand, the PMOS 21-12 connected to the inversion output terminal outb outputting the L level signal is OFF, so that the power consumption can be controlled in an amount corresponding to the PMOS 12-12 being in the OFF state. Similarly, even when an H level signal is outputted from the inversion output terminal outb, the rise speed of the H level signal is maintained by the PMOS 21-12 in the ON state, and it becomes possible to control the power consumption in an amount corresponding to the PMOS 21-11 being in the OFF state. Through control of the load-use PMOS 21-11 to 21-14 in this manner, control of the current from the power supply potential VDD is performed and the power consumption of single TFF can be reduced.

(b) According to the ½ N frequency divider of FIG. 5, the frequency divider is configured using the conventional MCML TFF 10-1 to 10-3 with respect to the circuit block operated at a high speed and using the TFF 30-(N−1) and 30-N of the second embodiment with respect to the circuit block whose frequency has fallen. By adopting this configuration, reduction of the power consumption of the entire frequency divider can be performed.

Third Embodiment (Configuration of Third Embodiment)

Figure 6:
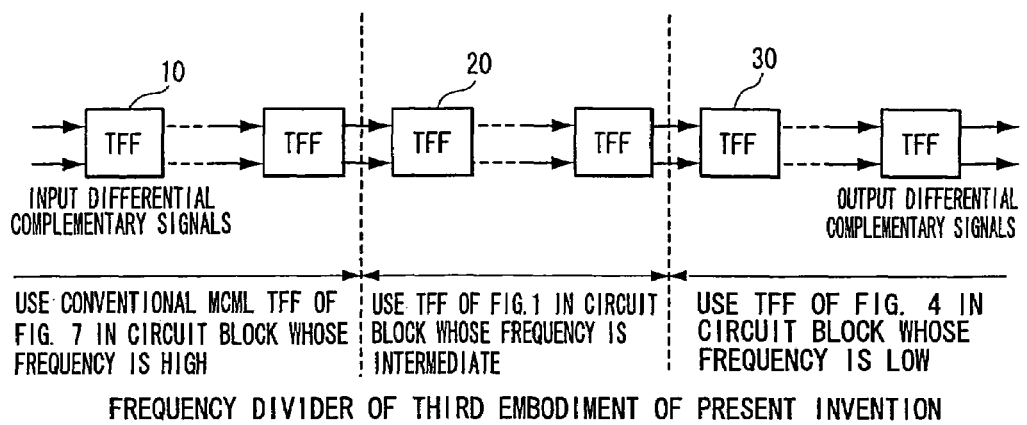
FIG. 6 is a configural diagram of a frequency divider pertaining to a third embodiment of the present invention.

FIG. 6 is a configural diagram of a frequency divider pertaining to a third embodiment of the present invention.

This frequency divider is configured using the conventional MCML TFF 10 shown in FIG. 7 in regard to the circuit block whose frequency is high, using the TFF 20 of FIG. 1 in regard to the circuit block whose frequency is low, and using the TFF 30 of FIG. 4 in regard to the circuit block operated at an intermediate frequency with respect to these two frequencies. It will be noted that the circuit block whose frequency is high, the circuit block whose frequency is intermediate, and the circuit block whose frequency is low may be appropriately selected on the basis of the following simulation result, for example.

(Operation of Third Embodiment)

In the frequency divider of the third embodiment, the frequency of the signal drops toward the later stages. In regard to the circuit block whose operating frequency is high and whose power consumption during operation is dominant, the circuit is operated at a high speed using the conventional MCML TFF 10 shown in FIG. 10. The circuit block where the frequency of later stages is low and whose power consumption during standby must be taken into consideration is configured using the TFF 30 of FIG. 4. The circuit block operated at an intermediate frequency with respect to these two circuit blocks and for which it is necessary to consider both power consumption during operation and power consumption during standby is configured using the TFF 20 of FIG. 1. By performing selection of the circuit configuration method of TFF to be used by their operating frequencies, power consumption with respect to the input signals of the frequency divider is optimized. This effect will be described using the simulation result of the ⅟16 frequency divider shown in FIG. 3.

Similar to the first embodiment, the simulation is performed assuming that MOS transistors created on an SOI board are used and under the conditions that the power supply potential is 1 V and the input signals are 7 GHz. When the TFF (1) to TFF (4) shown in FIG. 3 are all configured using the conventional MCML TFF 10 shown in FIG. 7, the power consumption is 2.4 mW. In contrast, the TFF (1) is configured using the conventional MCML TFF 10 shown in FIG. 7, the TFF (2) is configured using the TFF 20 of the first embodiment shown in FIG. 4, and the TFF (3) and the TFF (4) are configured using the TFF 30 of the second embodiment shown in FIG. 4. In this case, the power consumption is 1.5 mW, so that the power consumption is able to be reduced by about 35%.

(Effects of Third Embodiment)

According to the frequency divider of the third embodiment, the conventional MCML TFF 10 shown in FIG. 7 is used in the circuit block whose operating frequency is high, and the TFF 30 of the second embodiment shown in FIG. 4 is used in the circuit block whose frequency is low. Additionally, the circuit block operated at an intermediate frequency with respect to those two circuit blocks is configured using the TFF 20 of the first embodiment shown in FIG. 1. By selecting the circuit configuration method of TFF to be used by their operating frequencies, the power consumption of the frequency divider can be reduced.

The present invention is not limited to the above-described first to third embodiments, and various modifications and utilization modes are possible. As such modifications and utilization modes, there are the following (1) to (3), for example.

(1) In the first to third embodiments, a simulation is performed and effects are described assuming a case where the circuits are created on an SOI board, but the same effects can be obtained even when the circuit is created on a bulk board that is a semiconductor substrate. However, due to reasons described in the following (i) and (ii), higher effects can be expected when the circuits are created on an SOI board in comparison to when the circuit is created on a bulk board.

(i) In an MOS transistor created on an SOI board, the joining capacity is low because the active layer is thin in comparison to an MOS transistor created on a bulk board, and high-speed operation is possible.

(ii) In an MOS transistor created on an SOI board, the OFF leak current is small because the active layer is thin in comparison to an MOS transistor created on a bulk board. When the OFF leak currents are made substantially the same, an MOS transistor created on an SOI board can reduce the threshold voltage in comparison to an MOS transistor created on a bulk board, so that a reduction in the power supply potential becomes possible.

(2) The same action and effects are obtainable even when the load-use PMOS 21-1 to 21-4 and 11-1 to 11-4 are replaced by load elements such as resistors in FIG. 1 and FIG. 7. Or, it is also possible to reduction power consumption while maintaining the rise speed of the L level signal from the TFF by replacing the load-use PMOS 21-11 to 21-14 in FIG. 1 and FIG. 4 with other load transistors such as NMOS and changing the polarities of the electrodes.

(3) The latch portions 12A, 12B, 22A and 22B in FIG. 1, FIG. 4 and FIG. 7 may be configured using other transistors such as PMOS or may be changed to another circuit configuration that is not shown.

Embodiments of the present invention are described above, but the present invention is not limited to the embodiments as will be clear to those skilled in the art.

In the FF of the present invention, in an FF where latched complementary signals of first and second output terminals are inverted by complementary first and second input pulses, the conductivity of a first load transistor connected to the first output terminal is controlled by the signal from the second output terminal, and the conductivity of a second load transistor connected to the second output terminal is controlled by the signal from the first output terminal.

In the frequency divider of the present invention, in a frequency divider where N stages (where N is an integer equal to or greater than 2) of circuit blocks comprising FF where latched complementary signals of first and second output terminals are inverted by complementary first and second input pulses are cascade-connected and which divides the frequencies of the first and second input pulses into ½ N, the circuit block whose frequency is high is configured by a conventional FF and the circuit block whose frequency is low or whose frequency is intermediate is configured by the FF of the present invention.

According to the FF of the present invention, when an H level (or L level) signal is outputted from the first output terminal, an L level (or H level) signal is outputted from the second output terminal, whereby the first load transistor is switched to an ON state and the H level signal (or the L level signal) from the first output terminal rises (or falls) at the desired speed. At this time, on the other hand, the second load transistor connected to the second output terminal outputting the L level signal (or H level signal) is switched to an OFF state, so that the power consumption can be controlled in an amount corresponding to the second load transistor being in the OFF state. Similarly, even when an H level signal (or L level signal) is outputted from the second output terminal, the rise (or fall) speed of that H level signal is maintained by the second load transistor in the ON state, and it becomes possible to control the power consumption in an amount corresponding to the first load transistor being in the OFF state. Consequently, a reduction in power consumption can be achieved while maintaining the rise (or fall) speed of the H level signal (or the L level signal) from the TFF.

According to the frequency divide of the present invention, power consumption can be reduced while maintaining operating speed by selecting and configuring an appropriate FF by operating frequency.

What is claimed is:

1. A flip-flop circuit comprising:
   a first load element through which power supply current flows and that is connected between a first power supply potential and a first output terminal, the first output terminal and a second output terminal outputting complementary signals;
   a second load element that is connected between the first power supply potential and the second output terminal and through which power supply current flows;
   a first load transistor that is connected between the first power supply potential and the first output terminal and whose conductive state is controlled by the signal of the second output terminal;
   a second load transistor that is connected between the first power supply potential and the second output terminal and whose conductive state is controlled by the signal of the first output terminal;
   a first latch portion that is connected between a second power supply potential different from the first power supply potential and the first and second output terminals, latches the signals of the first and second output terminals, and inverts the latched signals of the first and second output terminals by complementary first and second input pulses and complementary signals of first and second output nodes;
   a third load element that is connected between the first power supply potential and the first output node and through which power supply current flows;
   a fourth load element that is connected between the first power supply potential and the second output node and through which power supply current flows;
   a third load transistor that is connected between the first power supply potential and the first output node and whose conductive state is controlled by the signal of the second output node;
   a fourth load transistor that is connected between the first power supply potential and the second output node and whose conductive state is controlled by the signal of the first output node; and
   a second latch portion that is connected between the second power supply potential and the first and second output nodes, latches the signals of the first and second output nodes, and inverts the latched signals of the first and second output nodes by the first and second input pulses and the signals of the first and second output terminals.

2. The flip-flop circuit of claim 1, wherein the first to fourth load elements and the first to fourth load transistors comprise PMOS.

3. The flip-flop circuit of claim 1, wherein the second power supply potential is a ground potential.

4. The flip-flop circuit of claim 1, wherein
   the first latch portion comprises
      a first transistor that is connected between the first output terminal and a first node and whose conductive state is controlled by the signal of the second output terminal,
      a second transistor that is connected between the first node and the second power supply potential and whose conductive state is controlled by the second input pulse,
      a third transistor that is connected between the first output terminal and a second node and whose conductive state is controlled by the signal of the second output node,
      a fourth transistor that is connected between the second node and the second power supply potential and whose conductive state is controlled by the first input pulse,
      a fifth transistor that is connected between the second output terminal and a third node and whose conductive state is controlled by the signal of the first output terminal,
      a sixth transistor that is connected between the third node and the second power supply potential and whose conductive state is controlled by the second input pulse,
      a seventh transistor that is connected between the second output terminal and a fourth node and whose conductive state is controlled by the signal of the first output node, and an eighth transistor that is connected between the fourth node and the second power supply potential and whose conductive state is controlled by the first input pulse, and the second latch portion comprises
- a ninth transistor that is connected between the first output node and a fifth node and whose conductive state is controlled by the signal of the second output node,
- a tenth transistor that is connected between the fifth node and the second power supply potential and whose conductive state is controlled by the first input pulse,
- an eleventh transistor that is connected between the first output node and a sixth node and whose conductive state is controlled by the signal of the first output terminal,
- a twelfth transistor that is connected between the sixth node and the second power supply potential and whose conductive state is controlled by the second input pulse,
- a thirteenth transistor that is connected between the second output node and a seventh node and whose conductive state is controlled by the signal of the first output node,
- a fourteenth transistor that is connected between the seventh node and the second power supply potential and whose conductive state is controlled by the first input pulse,
- a fifteenth transistor that is connected between the second output node and an eighth node and whose conductive state is controlled by the signal of the second output terminal, and
- a sixteenth transistor that is connected between the eighth node and the second power supply potential and whose conductive state is controlled by the second input pulse.

5. The flip-flop circuit of claim 4, wherein the first to sixteenth transistors comprise NMOS.

\* \* \* \* \*